(12) United States Patent
Chang et al.

(10) Patent No.: US 8,138,030 B2
(45) Date of Patent: Mar. 20, 2012

(54) ASYMMETRIC FINFET DEVICE WITH IMPROVED PARASITIC RESISTANCE AND CAPACITANCE

(75) Inventors: Josephine B. Chang, Yorktown Heights, NY (US); Leland Chang, Yorktown Heights, NY (US); Chung-Hsun Lin, Yorktown Heights, NY (US); Jeffrey W. Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 12/559,996

(22) Filed: Sep. 15, 2009

(65) Prior Publication Data

US 2011/0065244 A1    Mar. 17, 2011

(51) Int. Cl.
*H01L 21/336*    (2006.01)
(52) U.S. Cl. . 438/151; 257/335; 257/345; 257/E29.279; 257/E29.268; 257/E29.266; 257/E29.053; 438/149; 438/199; 438/283
(58) Field of Classification Search .......... 257/335–345, 257/E29.279, E29.268, E29.266, E29.053; 438/149, 199, 283
See application file for complete search history.

(56) References Cited

U.S. PATENT DOCUMENTS

| | | | |
|---|---|---|---|
| 6,686,245 B1 | 2/2004 | Mathew et al. | |
| 6,800,885 B1 | 10/2004 | An et al. | |
| 6,849,884 B2 | 2/2005 | Clark et al. | |
| 7,064,019 B2 | 6/2006 | Fried et al. | |
| 7,410,876 B1 * | 8/2008 | Min et al. | 438/301 |
| 2005/0148137 A1 * | 7/2005 | Brask et al. | 438/216 |
| 2008/0001227 A1 | 1/2008 | Zhu et al. | |
| 2008/0111185 A1 | 5/2008 | Cheng | |

OTHER PUBLICATIONS

Kedzierski et al., "High-performance symmetric-gate and CMOS-compatible Vt asymmetric-gate FinFET devices," IEEE, 2001, pp. 437-440, IEDM 01; retrieved from the Internet on Dec. 8, 2008 from IEEE Xplore.

* cited by examiner

*Primary Examiner* — A. Sefer
*Assistant Examiner* — Ermias Woldegeorgis
(74) *Attorney, Agent, or Firm* — Cantor Colburn LLP; Vazken Alexanian (57) ABSTRACT

A method for forming a fin field effect transistor (finFET) device includes, forming a fin structure in a substrate, forming a gate stack structure perpendicular to the fin structure, and implanting ions in the substrate at an angle (θ) to form a source region and a drain region in the substrate, wherein the angle (θ) is oblique relative to the source region.

11 Claims, 8 Drawing Sheets

ASYMMETRIC FINFET DEVICE WITH IMPROVED PARASITIC RESISTANCE AND CAPACITANCE

FIELD OF INVENTION

The present invention relates generally to semiconductor device manufacturing and, more particularly, to an asymmetric fin Field Effect Transistor (finFET) device with improved parasitic resistance and capacitance.

DESCRIPTION OF RELEVANT ART

Extrinsic resistance and fringing capacitances reduce the performance of finFET devices. Methods fabrication and structures that reduce the parasitic resistance and capacitance are desired.

BRIEF SUMMARY

In one aspect of the present invention, a method for forming a fin field effect transistor (finFET) device includes, forming a fin structure in a substrate, forming a gate stack structure perpendicular to the fin structure, and implanting ions in the substrate at an angle (θ) to form a source region and a drain region in the substrate, wherein the angle (θ) is oblique relative to the source region.

In another aspect of the present invention, a method for forming a plurality of fin field effect transistor (finFET) devices includes forming a plurality of fin structures in a substrate, forming a plurality of gate stack structure perpendicular to the fin structure, masking the gate stack structure and associated fin structures of devices designated for a first type of doping with a first type of ions, masking the gate stack structures and associated fin structures of devices designated for a second type of doping orientated in a first direction, and implanting a second type of ions in the substrate at an angle (θ) to form a source region and a drain region in the substrate, wherein the angle (θ) is oblique relative to the exposed source regions.

BRIEF DESCRIPTION OF THE SEVERAL VIEWS OF THE DRAWINGS

Referring to the exemplary drawings wherein like elements are numbered alike in the several Figures:

FIGS. 2A-2H illustrate an exemplary method for fabricating the device of FIG. 1.

DETAILED DESCRIPTION

Disclosed herein are structures and methods of forming finFET devices.

Figure 1:
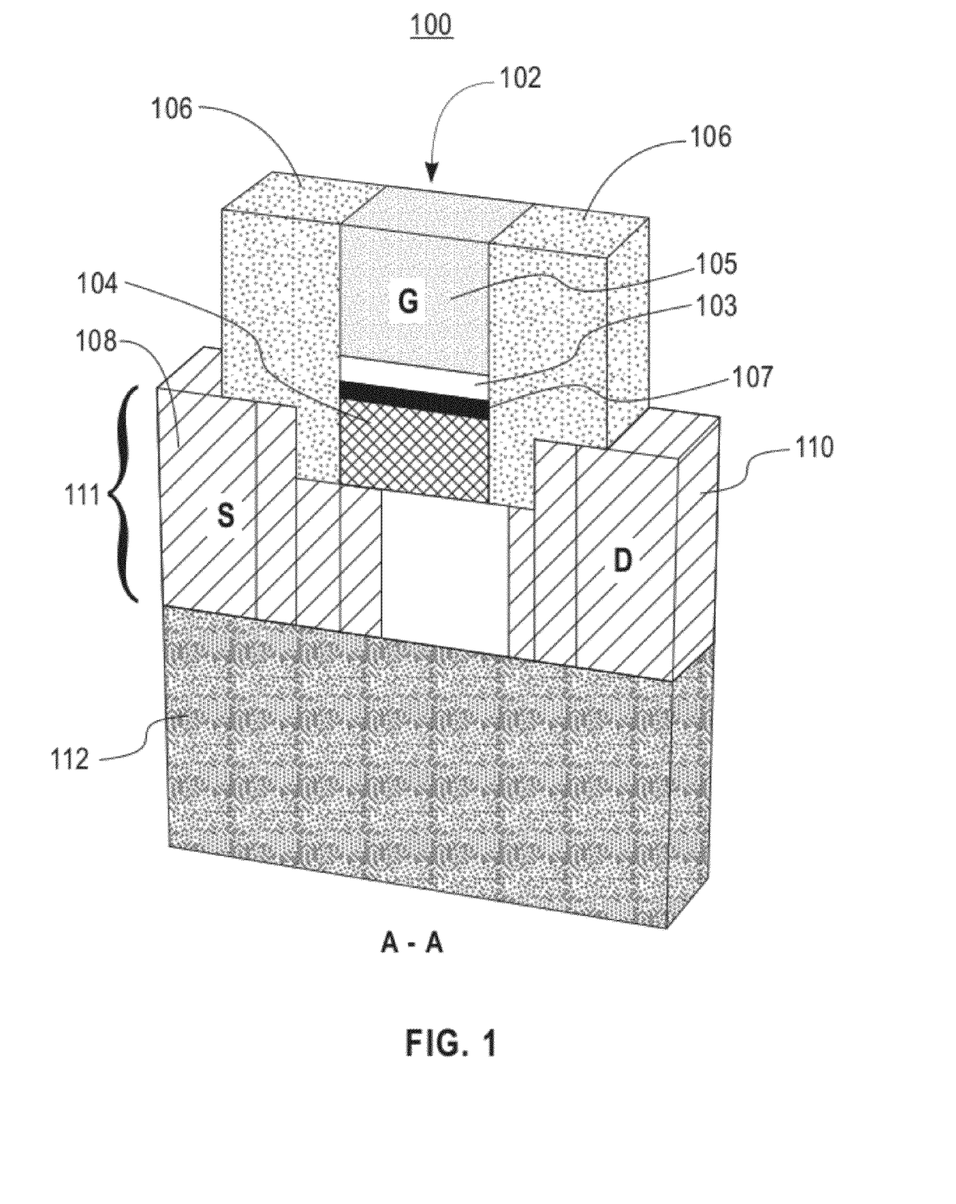
FIG. 1 is a perspective cut-away view of an exemplary embodiment of an asymmetric finFET device.

Referring initially to FIG. 1, there is shown a perspective cut-away view of an exemplary embodiment of an asymmetric finFET device 100 along the line A-A (of FIG. 2H described below). The device includes a gate stack portion 102 disposed on a hardmask portion 104. The gate stack portion 102 may include, for example a polysilicon layer 105, a metal gate 103, and a high K layer 107 disposed on doped regions (N-type or P-type) of a silicon on insulator layer (SOI) 111. The doped regions include a source region 108 and a drain region 110. In alternate embodiments, the SOI layer 111 may be, for example, a bulk silicon layer. The SOI layer is disposed on a buried oxide substrate 112. The gate stack portion 102 is adjacent to spacers 106. The spacers 106 may be formed from, for example, Silicon nitride (SiN), or Silicon Oxide (SiO2). In the illustrated embodiment, the source region 108 is partially overlapped by the gate stack portion 102, while the drain region 110 is offset from the gate stack portion 102.

In operation, the overlap of the gate stack portion 102 and the offset of the drain region 110 reduces the extrinsic resistance (Rext) and the fringing capacitances of the device 100. Particularly, the offset of the drain region 110 reduces the Miller capacitance while the overlapped source region 108 reduces the resistance. This approach will result in a resistance-capacitance (RC) benefit.

Figure 2A:
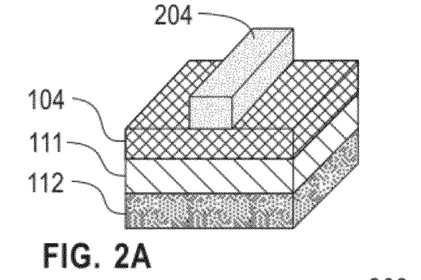
Figure 2B:
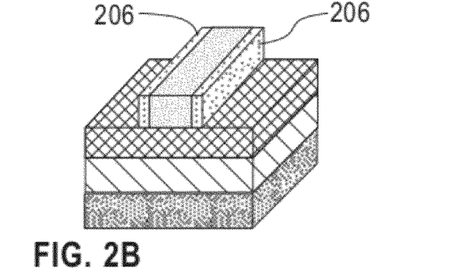
Figure 2C:
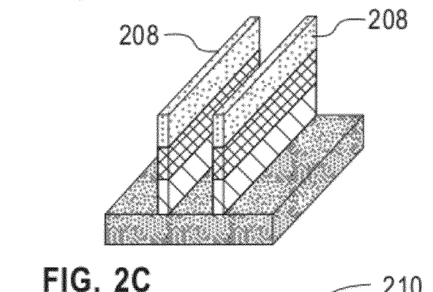
Figure 2D:
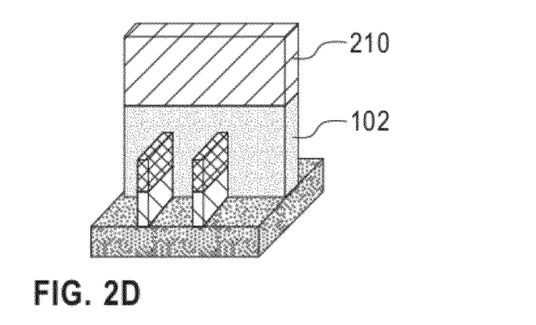
Figure 2E:
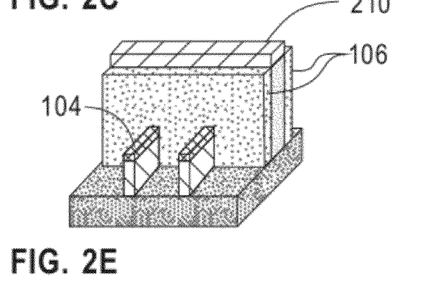
Figure 2F:
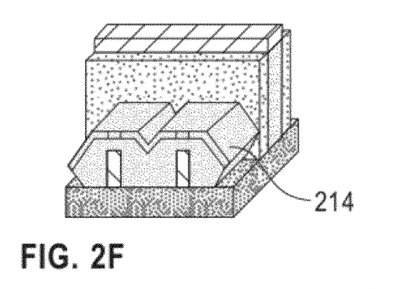
Figure 2G:
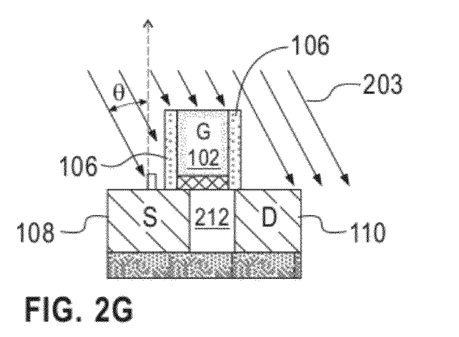

FIGS. 2A-2H illustrate an exemplary method for fabricating the device 100. Referring to FIG. 2A, a silicon dioxide (SiO2) (or Silicon Nitride (SiN)) hardmask layer 104 is formed on the SOI layer 111, and a polysilicon structure 204 is formed on the hardmask layer 104 by deposition and etching processes. Referring to FIG. 2B, silicon nitride structures 206 are formed along the sides of the polysilicon structure 204 using deposition and etching processes. In FIG. 2C, the polysilicon structure 204 and portions of the hardmask layer 104 and the SOI layer 111 are etched to form the fin structures 208. In FIG. 2D, the structures 206 are etched, and the gate stack portion 102 (of FIG. 1) and a SiN layer 210 is formed perpendicular to the fin structures 208. Referring to FIG. 2E, portions of the hardmask layer 104 and the SiN layer 210 are removed, and the spacers 106 are formed along the gate stack portion 102. In FIG. 2F, an epitaxial silicon (Epi Si) layer 214 is deposited over the fin structures 208. FIG. 2G illustrates a cross sectional view the ion implant that forms the source 108 and drain 110 regions in the SOI layer 111. The ions 203 are implanted at an angle (θ) from a line perpendicular the to source region 108. The gate stack portion 102, and the spacers 106 partially block some of the ions 203 from being deposited in a great concentration in the portion 212 of the SOI layer 111, and the implant at the oblique angle (θ) results in the overlapped source region 108 and the offset drain region 110. The implant angle may range from 0-90 degrees, and any additional ranges between 0-90 degrees. An exemplary implant angle of 20-30 degrees is shown in the illustrated embodiments. Referring to FIG. 2H, a silicide layer 216, is formed on the Epi Si layer 214 and over the gate stack portion 102.

Figure 3:
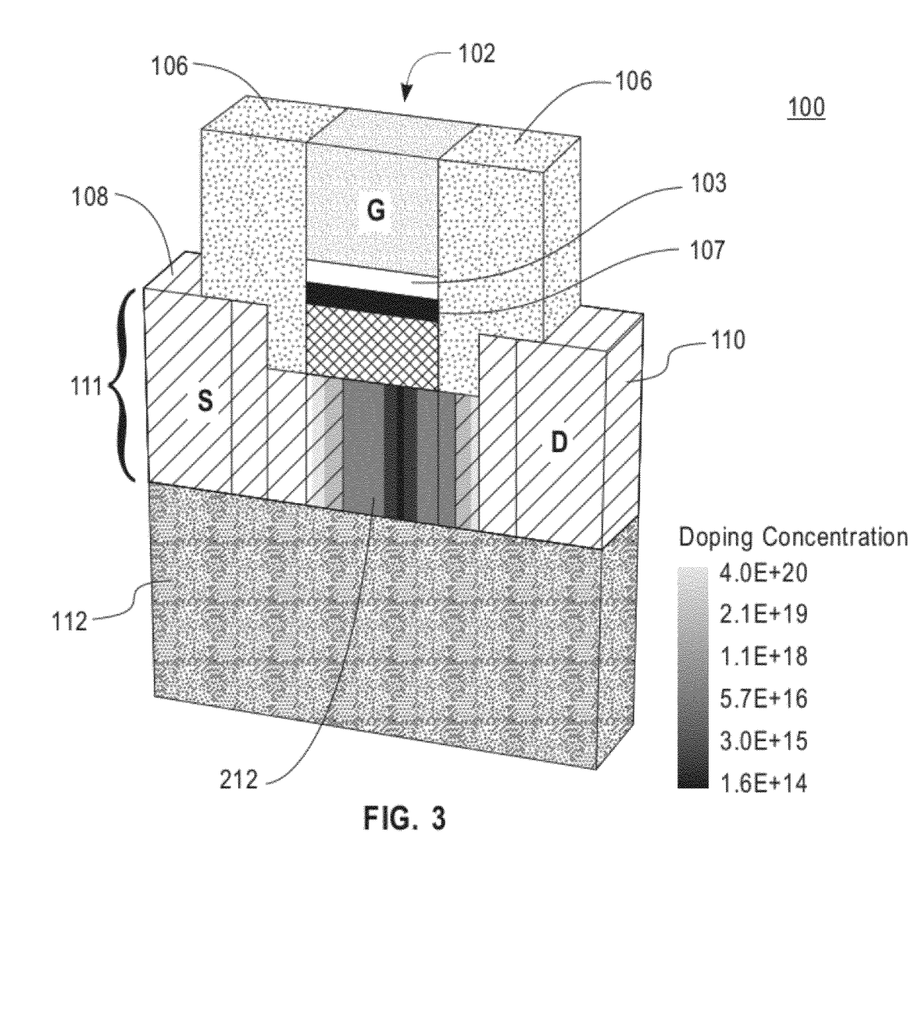
FIG. 3 illustrates another perspective cut-away view of the device.

FIG. 3 illustrates a cross sectional view of the device 100 showing and example of the concentrations of the ions deposited in the source and drain regions 108 and 110, and the portion 212 of the SOI layer 111.

Figure 4A:
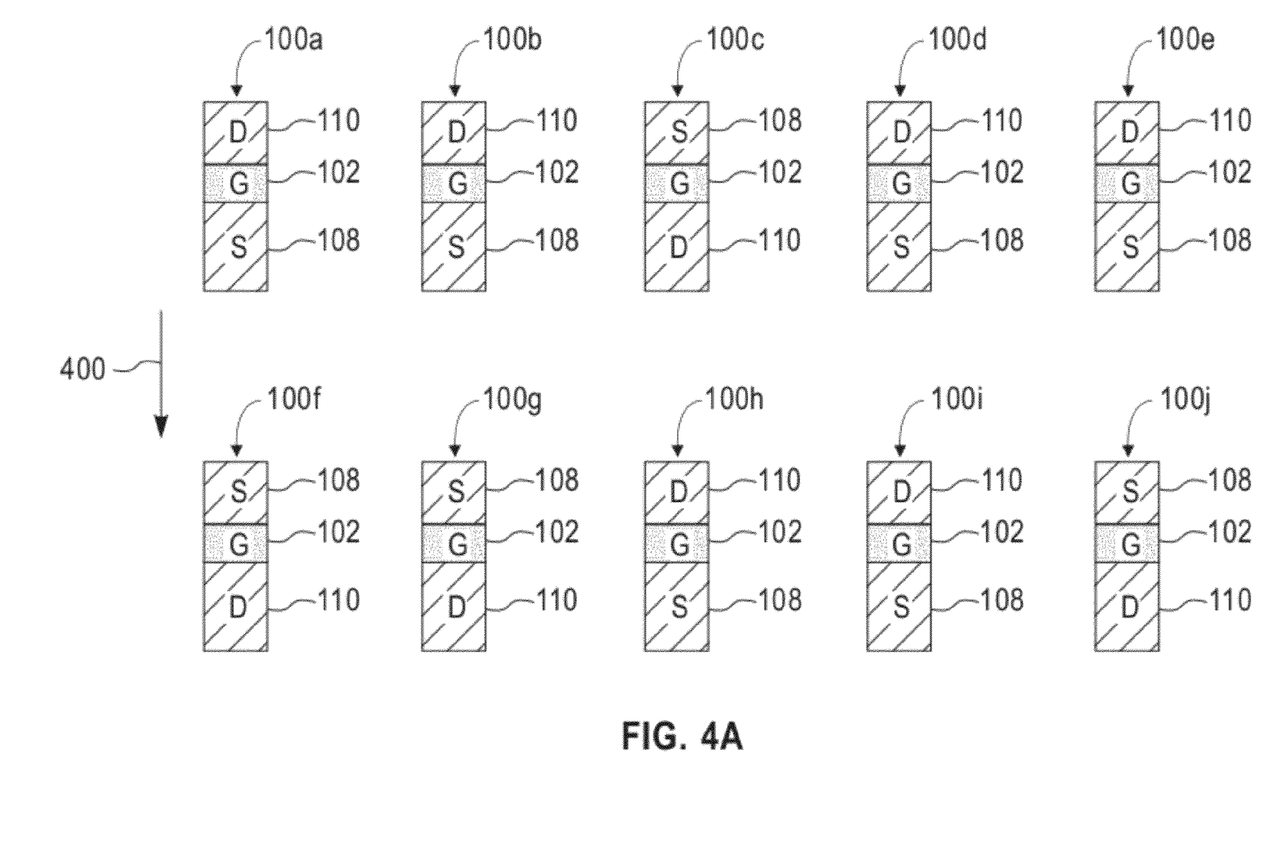
FIGS. 4A-4E illustrate an exemplary method for forming a plurality of devices.
Figure 4B:
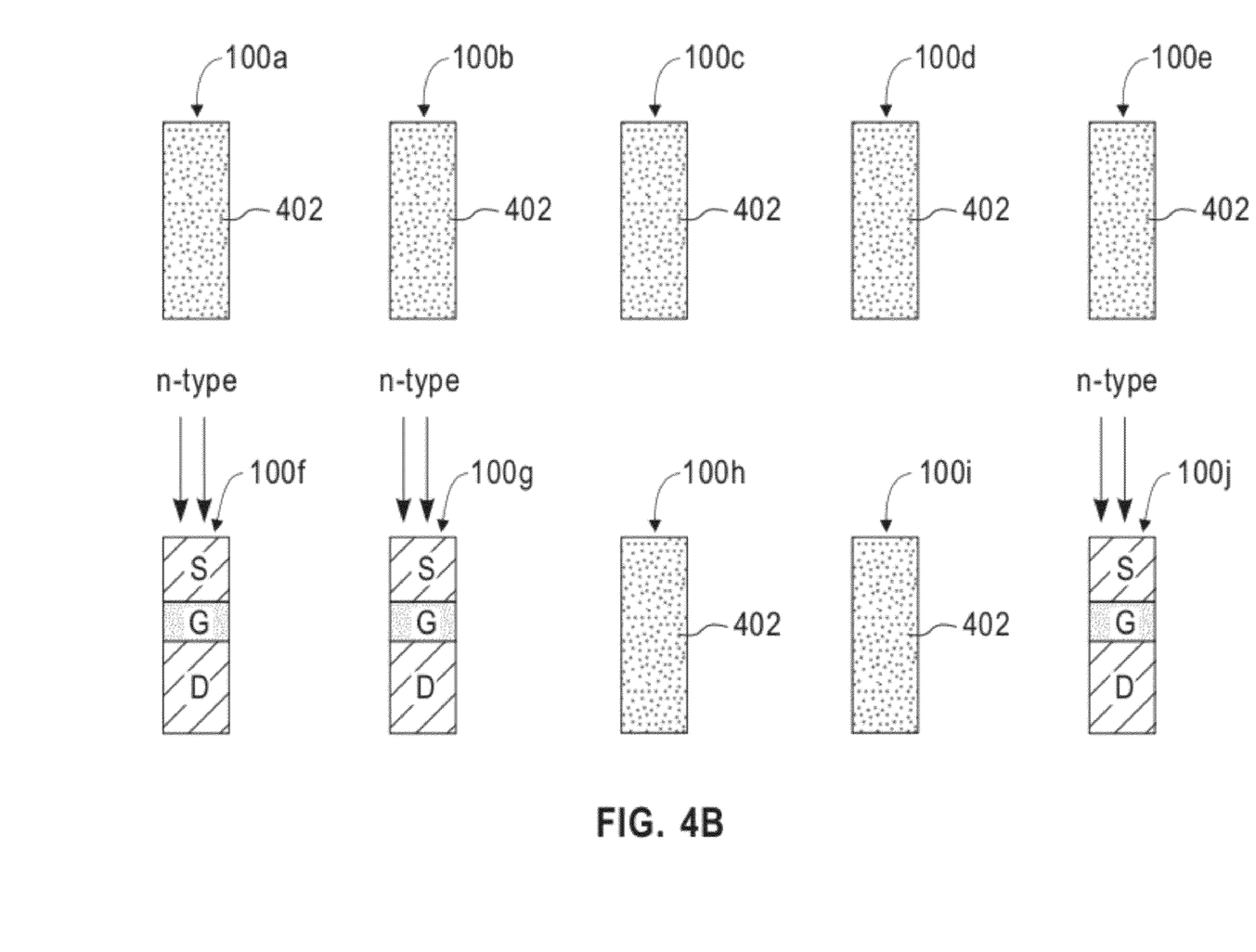
Figure 4C:
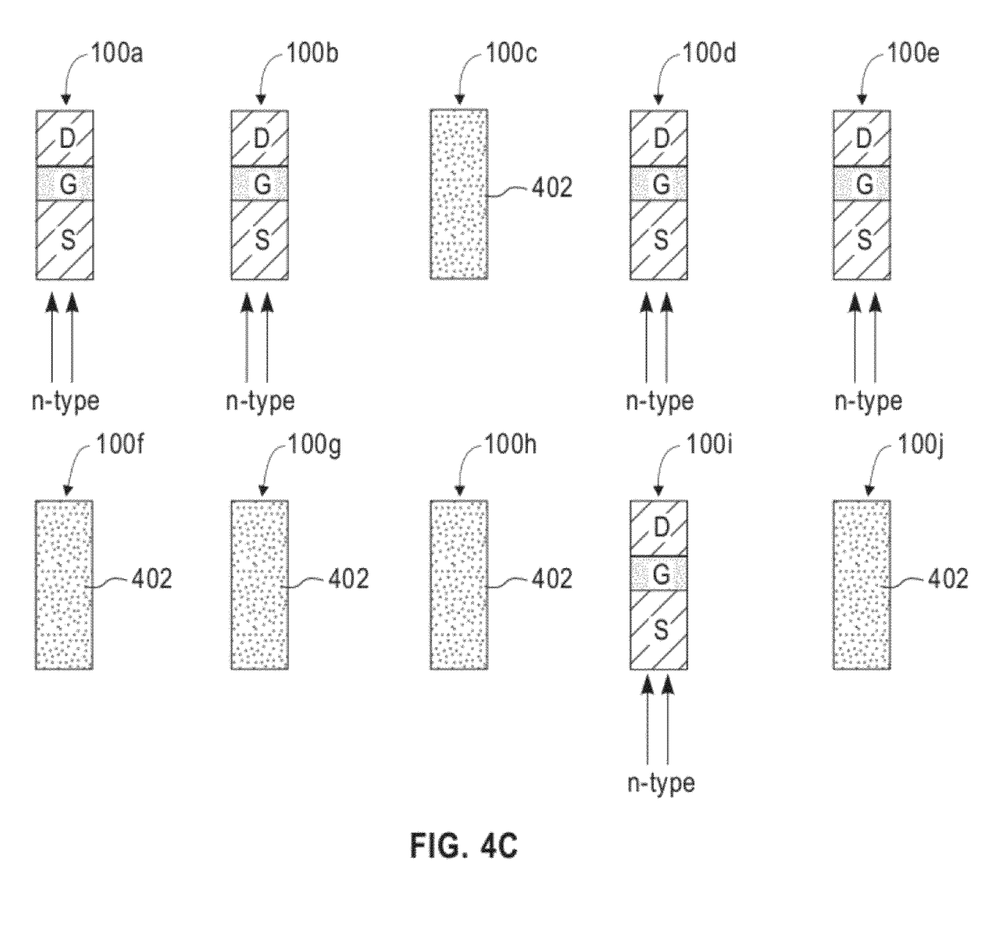
Figure 4D:
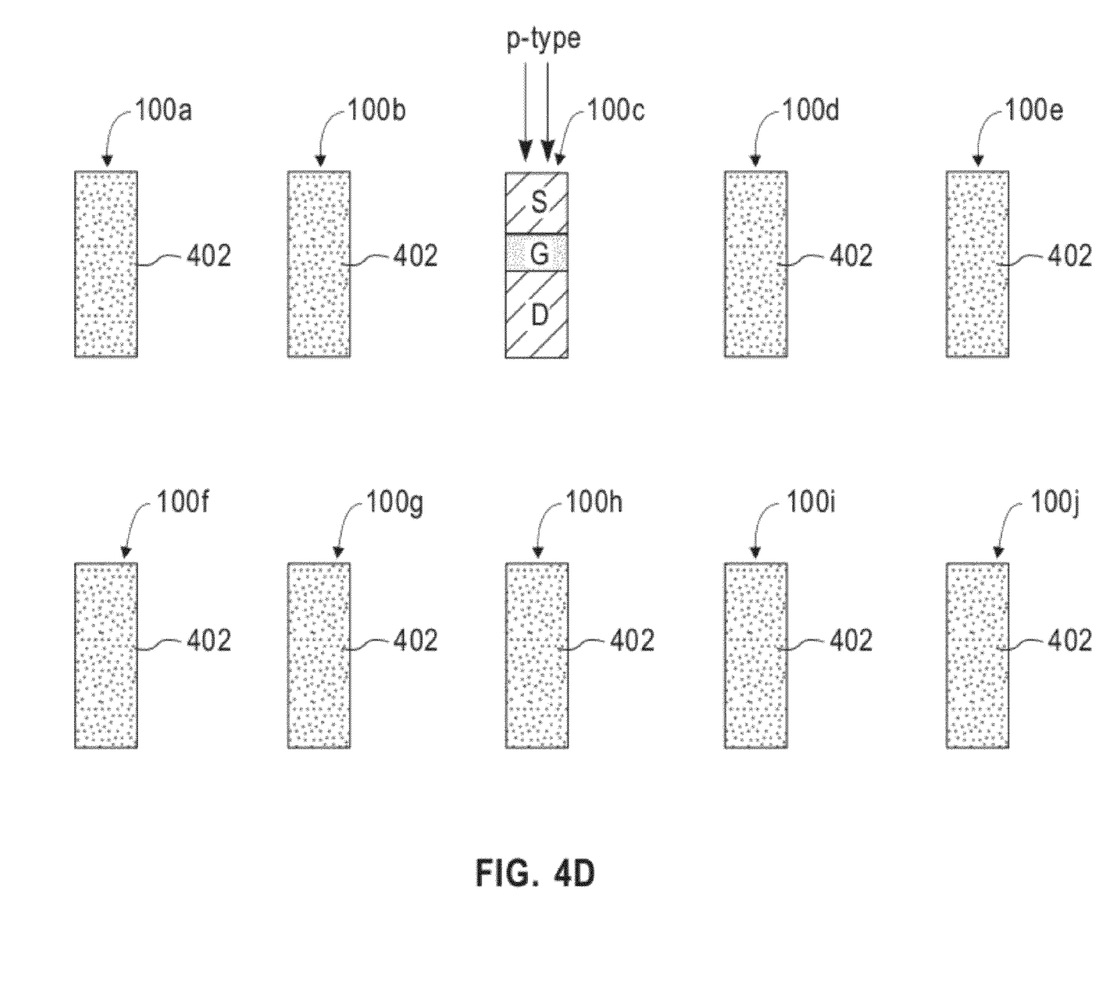
Figure 4E:
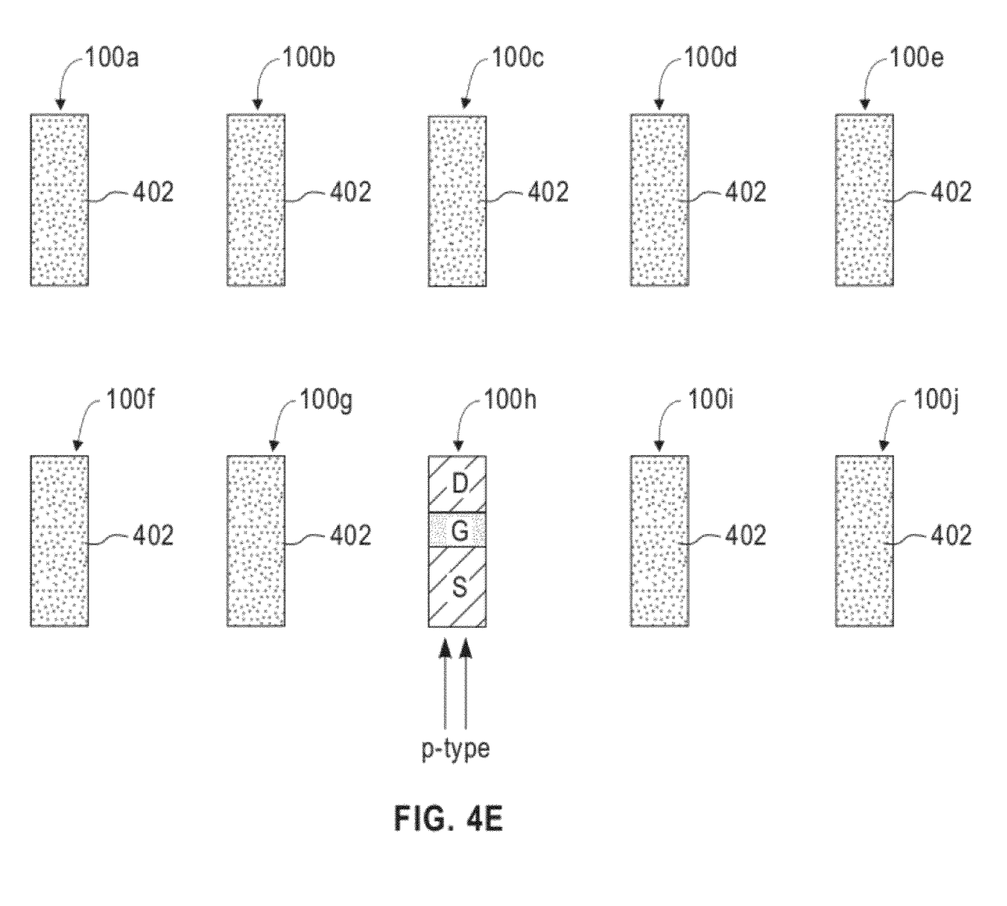

FIGS. 4A-4E illustrate an exemplary method for forming a plurality of devices 100. In this regard, the plurality of devices 100 may include n-type and p-type finFETS that are orientated in different directions. Referring to FIG. 4A, an array of devices 100 are shown. Some of the devices 100 (a, b, d, e, h, and i) are oriented with the source regions 108 "down" or on the side of the gate stack 102 indicated by the arrow 400. While the other devices 100 (c, f, g, and j) are orientated with the source regions 108 "up." In the illustrated embodiment, the devices 100 designated for n-type doping (NFETs) will be doped before the p-type doping, however p-type doping to form PFETs may alternatively be performed prior to n-type doping. Referring to FIG. 4B, the devices designated for p-type doping (100h and 100c), and the n-type devices orientated down 100 (a, b, d, e, and i) are covered by a lithographed masking layer 402. (Symmetric devices that will be doped perpendicular to the substrate, i.e. not at an oblique angle, may also be covered by the masking layer 402). The n-type doping is performed at an angle (θ) relative to the source regions 108 of the "up" orientated devices (100 f, g, and j) (Some of the doping may be performed perpendicular to the source region 108 if desired.) resulting in a similar structure to the overlapped source regions and offset drain regions of FIG. 1. In FIG. 4C, devices 100 (a, b, d, e, and i) designated for n-type doping and orientated with source "down" are unmasked, and the devices 100 (f, g, and j) are masked. The devices 100 (a, b, d, e, and i) are doped at an angle (θ) relative to the source regions 108 of the "down" orientated devices. Any symmetric n-type devices may be unmasked, and with the non-symmetric and p-type devices masked to allow n-type doping at an angle perpendicular to the source region 108 if desired. FIG. 4D illustrates the unmasked p-type device 100c orientated "up" unmasked and doped at an angle (θ) relative to the source region 108 of device 100c. In FIG. 4E, device 100c is masked, and device 100h is unmasked and doped at an angle (θ) relative to the source region 108 of 100h.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming fin field effect transistor (finFET) devices comprising:

forming a fin structure in a substrate;

forming a gate stack structure perpendicular to the fin structure; and masking a first portion of the gate stack structure and a first portion of the fin structure;

implanting a first type of ions at a first oblique angle to form a first source and drain region in the substrate, wherein the first oblique angle is between 1 and 89 degrees relative to the first source region;

masking the first source and drain region;

removing a portion of the masking from the first portion of the gate stack structure and the first portion of the fin structure;

implanting the first type of ions at a second oblique angle to form a second source and drain region in the substrate, wherein the second oblique angle is between 91 and 179 degrees relative to the first source region;

masking the second source and drain region;

removing another portion of the masking from the first portion of the gate stack structure and the first portion of the fin structure; and implanting a second type of ions at the first oblique angle to form a third source and drain region in the substrate.

2. The method of claim 1, wherein the substrate is a silicon on insulator (SOI).

3. The method of claim 1, wherein the substrate is a bulk silicon layer.

4. The method of claim 1, wherein the source region and drain regions are partially defined by the fin structure.

5. The method of claim 1, wherein the gate stack structure includes a metal layer and a polysilicide layer.

6. The method of claim 1, wherein the method further comprises, forming spacers adjacent to the gate stack structure.

7. The method of claim 6, wherein the spacers comprise silicon nitride (SiN).

8. The method of claim 1, wherein the method further comprises depositing a layer of epitaxial silicon (Epi Si) on the fin structure.

9. The method of claim 8, wherein the method further comprises depositing a capping layer on the layer of Epi Si and the gate stack structure.

10. The method of claim 1, wherein the oblique angle (θ) is between 1 degree and 89 degrees.

11. The method of claim 1, wherein the oblique angle (θ) is between 20 degrees and 30 degrees.

* * * * *